(12) United States Patent
Xu

(10) Patent No.: US 10,381,085 B2
(45) Date of Patent: Aug. 13, 2019

(54) ERASING MEMORY CELLS

(71) Applicant: MICRON TECHNOLOGY, INC., Boise, ID (US)

(72) Inventor: Jun Xu, Shanghai (CN)

(73) Assignee: Micron Technogy, Inc., Boise, ID (US)

( * ) Notice: Subject to any disclaimer, the term of this patent is extended or adjusted under 35 U.S.C. 154(b) by 271 days.

(21) Appl. No.: 15/503,786

(22) PCT Filed: Oct. 27, 2016

(86) PCT No.: PCT/CN2016/103586
§ 371 (c)(1),
(2) Date: Feb. 14, 2017

(87) PCT Pub. No.: WO2018/076239
PCT Pub. Date: May 3, 2018

(65) Prior Publication Data
US 2019/0066798 A1    Feb. 28, 2019

(51) Int. Cl.
*G11C 16/26* (2006.01)
*G11C 16/16* (2006.01)
*G11C 16/04* (2006.01)

(52) U.S. Cl.
CPC .......... *G11C 16/16* (2013.01); *G11C 16/0483* (2013.01); *G11C 16/26* (2013.01)

(58) Field of Classification Search
CPC ................................ G11C 16/10; G11C 16/26
USPC ........................................ 365/185.24, 185.29
See application file for complete search history.

(56) References Cited

U.S. PATENT DOCUMENTS

| 7,978,527 B2 * | 7/2011 | Hemink | G11C 16/3418 365/185.17 |
| 8,064,267 B2 | 11/2011 | Sarin et al. | |
| 8,098,530 B2 | 1/2012 | Sarin | |
| 8,559,235 B2 * | 10/2013 | Yoon | G11C 16/0483 365/185.29 |
| 8,638,605 B2 * | 1/2014 | Tessariol | G11C 16/10 365/185.05 |
| 8,755,229 B1 * | 6/2014 | Beltrami | G11C 16/3463 365/185.18 |

(Continued)

OTHER PUBLICATIONS

S. Mahapatra, et al., "Performance and Reliability of High Density Flash EEPROMs Under CHISEL Programming Operation", ESSDERC 2002, pp. 351-354.

*Primary Examiner* — Michael T Tran
(74) *Attorney, Agent, or Firm* — Dicke, Billig & Czaja, PLLC

(57) ABSTRACT

Apparatus and methods of operating such apparatus include applying a first voltage level to a source connected to a first end of a string of series-connected memory cells, applying a second voltage level to a data line connected to a second end of the string of series-connected memory cells, and applying a third voltage level to a first access line coupled to a first memory cell of the string of series-connected memory cells concurrently with applying the first and second voltage levels, wherein the magnitude of the third voltage level is greater than the magnitude of both the first voltage level and the second voltage level, and wherein a polarity and the magnitude of the third voltage level are expected to decrease a threshold voltage of the first memory cell when concurrently applying the first, second and third voltage levels.

18 Claims, 8 Drawing Sheets

(56) References Cited

U.S. PATENT DOCUMENTS

| | | | |
|---|---|---|---|
| 8,804,424 B2* | 8/2014 | Sakui | G11C 16/0433 365/185.17 |
| 9,136,005 B2* | 9/2015 | Choe | G11C 16/14 |
| 9,263,133 B2 | 2/2016 | Banna et al. | |
| 9,355,731 B2* | 5/2016 | Shiga | G11C 16/14 |
| 9,412,450 B2* | 8/2016 | Lee | G11C 16/26 |
| 9,530,506 B2* | 12/2016 | Rabkin | G11C 16/10 |
| 9,536,613 B2* | 1/2017 | Lee | G11C 16/10 |
| 9,558,834 B2* | 1/2017 | Choe | G11C 16/14 |
| 9,564,220 B2* | 2/2017 | An | G11C 16/0483 |
| 9,564,234 B2* | 2/2017 | Kwak | G11C 16/26 |
| 9,564,236 B2* | 2/2017 | Suito | G11C 16/3445 |
| 9,575,833 B2* | 2/2017 | Jeon | G06F 11/1068 |
| 9,576,668 B2* | 2/2017 | Kim | G11C 16/26 |
| 9,595,333 B2* | 3/2017 | Sim | G11C 16/10 |
| 9,606,864 B2* | 3/2017 | Lee | G06F 11/1068 |
| 9,607,702 B2* | 3/2017 | Chang | G11C 16/0483 |
| 9,620,217 B2* | 4/2017 | Lue | G11C 16/0483 |
| 9,632,868 B2* | 4/2017 | Song | G11C 11/5642 |
| 9,646,698 B2* | 5/2017 | Lee | G11C 16/08 |
| 9,659,663 B2* | 5/2017 | Shirakawa | G11C 16/26 |
| 9,666,286 B2* | 5/2017 | Lee | G11C 16/24 |
| 9,679,659 B2* | 6/2017 | Shim | G11C 16/16 |
| 9,715,938 B2* | 7/2017 | Yang | G11C 16/34 |
| 9,720,595 B2* | 8/2017 | Kwak | G11C 11/5628 |
| 9,734,898 B2* | 8/2017 | Seol | G11C 11/5621 |
| 9,755,439 B2* | 9/2017 | Yamamoto | H02J 7/0016 |
| 9,761,310 B2* | 9/2017 | Hsu | G11C 14/0018 |
| 9,798,614 B2* | 10/2017 | Kim | G06F 11/1012 |
| 9,799,401 B2* | 10/2017 | Kim | G11C 16/10 |
| 9,805,812 B2* | 10/2017 | Kwak | G11C 16/34 |
| 9,819,362 B2* | 11/2017 | Motwani | H03M 13/1102 |
| 9,824,759 B2* | 11/2017 | Kwon | G11C 16/10 |
| 9,859,007 B2* | 1/2018 | Suzuki | G11C 16/10 |
| 9,875,805 B2* | 1/2018 | Tseng | G11C 16/3459 |
| 9,934,872 B2* | 4/2018 | Magia | G06F 3/0619 |
| 10,127,964 B2* | 11/2018 | Sun | G11C 29/023 |
| 10,141,063 B2* | 11/2018 | Chih | G11C 16/3427 |
| 10,199,106 B2* | 2/2019 | Kim | G06F 11/10 |
| 2006/0160305 A1 | 7/2006 | Mokhlesi et al. | |
| 2007/0047328 A1* | 3/2007 | Kim | G11C 16/0483 365/185.29 |
| 2008/0285355 A1* | 11/2008 | Lee | G11C 16/12 365/185.33 |
| 2013/0163336 A1 | 6/2013 | Li et al. | |
| 2015/0221347 A1 | 8/2015 | Koval et al. | |
| 2015/0279473 A1 | 10/2015 | Yoo et al. | |
| 2017/0117049 A1* | 4/2017 | Rajwade | G11C 16/16 |
| 2017/0140833 A1* | 5/2017 | Caillat | G11C 16/3445 |

* cited by examiner

US 10,381,085 B2

ERASING MEMORY CELLS

RELATED APPLICATION

This application is a U.S. National Stage Application of International Application No. PCT/CN2016/103586, filed Oct. 27, 2016.

TECHNICAL FIELD

The present disclosure relates generally to memory and, in particular, in one or more embodiments, the present disclosure relates to erasing memory cells.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Memory cells are typically erased before they are programmed to a desired data state. For example, memory cells of a particular block of memory cells may first be erased and then selectively programmed. For a NAND array, a block of memory cells is typically erased by grounding all of the access lines (e.g., word lines) in the block and applying an erase voltage to the channels of the memory cells (e.g., through data lines and source connections) in order to remove charges that might be stored on charge storage structures (e.g., floating gates or charge traps) of the block of memory cells. Typical erase voltages might be on the order of 25V before completion of an erase operation. For programming of these memory cells, one or more programming pulses are typically applied to a selected access line connected to a control gate of each memory cell associated with that selected access line. Typical programming pulses might start at or near 15V and may increase in magnitude during each subsequent programming pulse application. Programming pulses on the order of 25V might be experienced before completion of a programming operation. While the programming pulse is applied to the selected access line, a ground potential might be applied to the channels of the memory cells, resulting in a charge transfer from the channel to the charge storage structures of memory cells targeted (e.g., selected) for programming.

DETAILED DESCRIPTION

Figure 1:
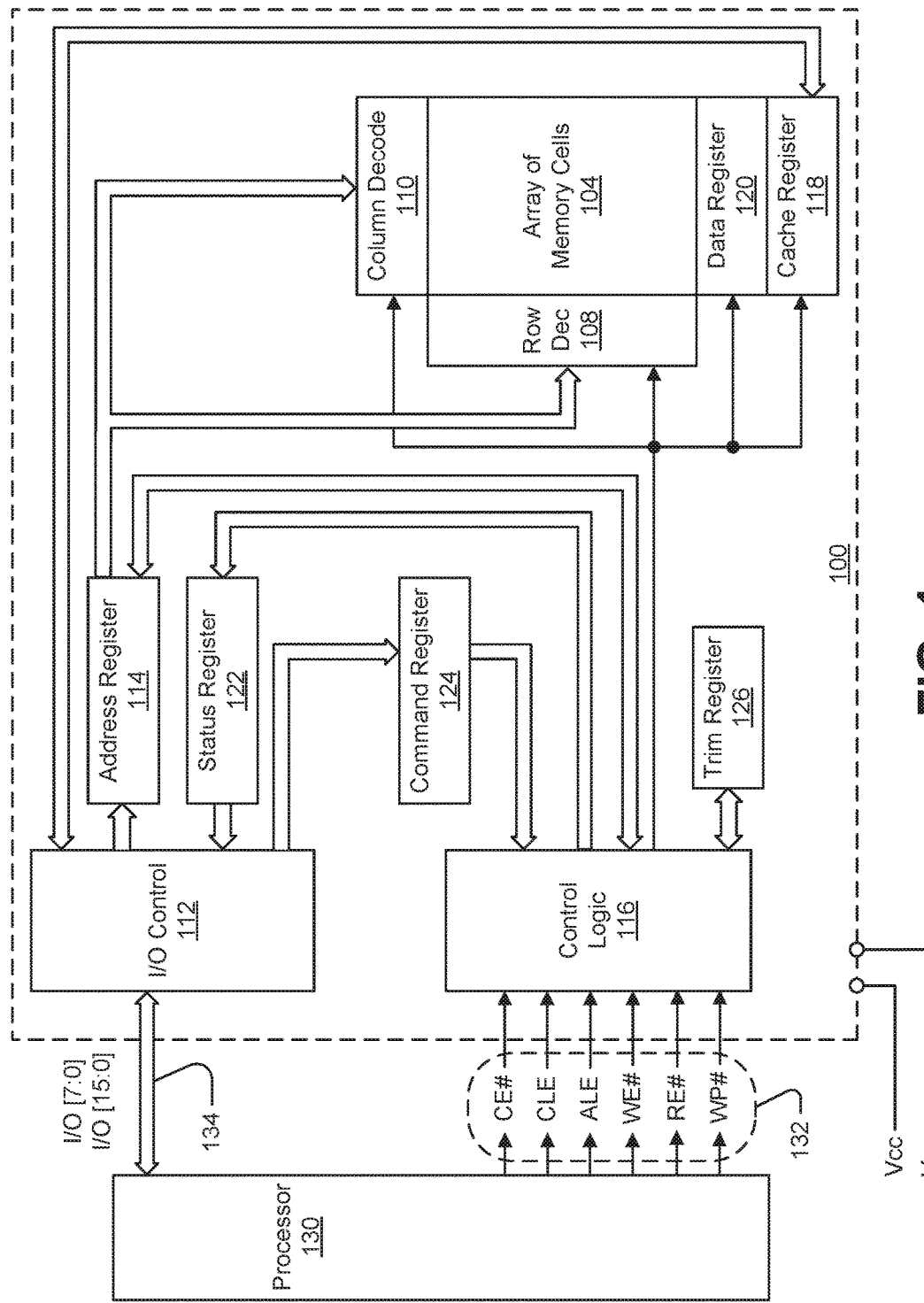
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 126 may be in communication with the control logic 116 to store trim data. Although depicted as a separate storage register, trim register 126 may represent a portion of the array of memory cells 104.

A controller (e.g., control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

Memory device 100 may be configured to receive a supply voltage Vcc and a reference potential (e.g., ground or 0V) Vss. The supply voltage Vcc may represent a lowest positive supply voltage received by the memory device 100 relative to a voltage level of the reference potential Vss.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
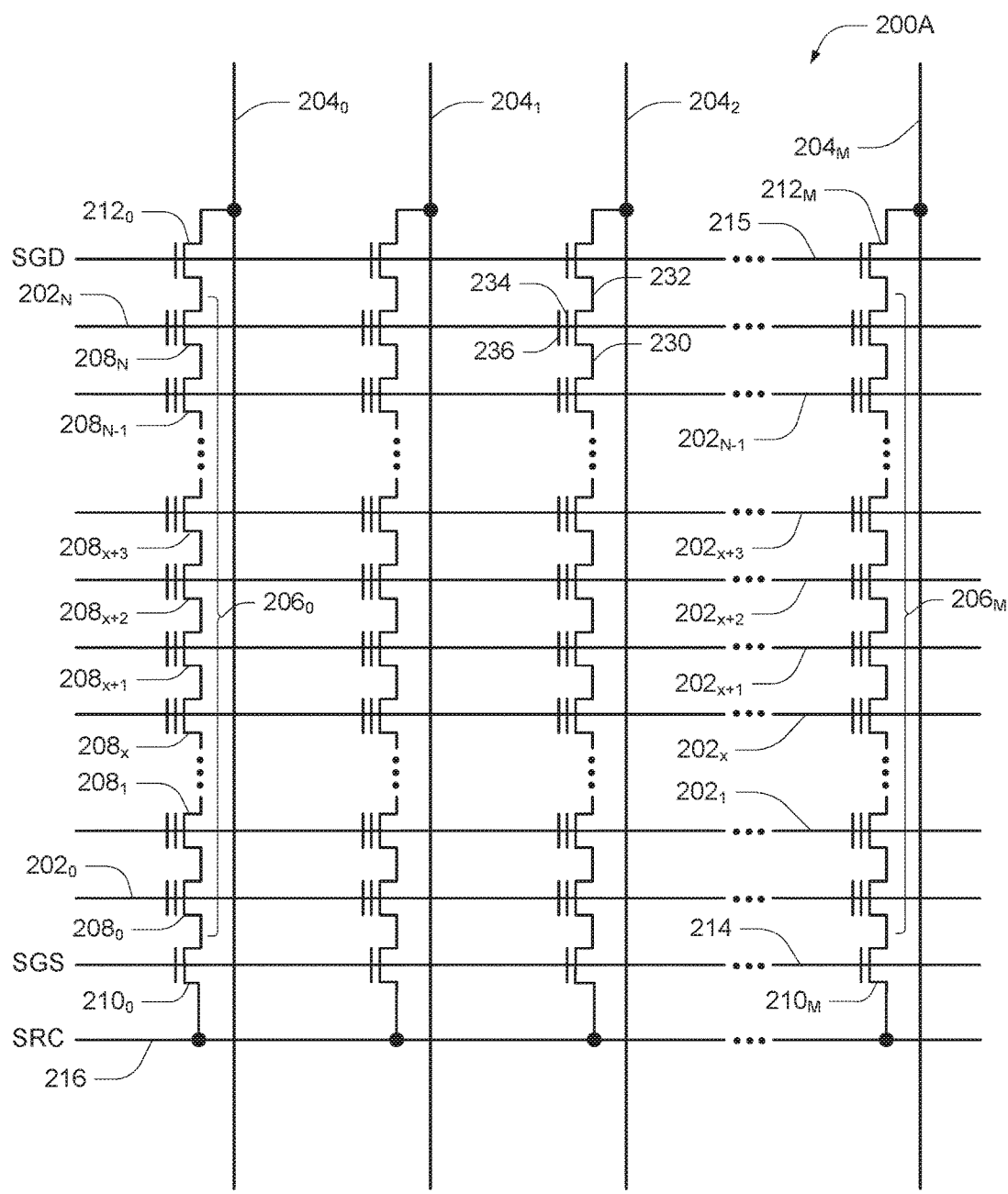
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells, such as one of NAND strings $206_0$ to $206_M$. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source 230 and a defined drain 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Memory devices may be configured to operate using more than one (e.g., two) nominal levels of the supply voltage Vcc. For example, a memory device might be configured to operate using either a Vcc having a nominal level of 1.8V (e.g., corresponding to a range of 1.65V-1.95V) or a Vcc having a nominal level of 3.3V (e.g., corresponding to a range of 2.7V-3.6V). In some cases, a memory device configured to operate using one of multiple nominal levels of the supply voltage Vcc might further be configured to generate an internal voltage supply having a voltage level corresponding to (e.g., equal to) a voltage level within the range of acceptable values corresponding to a particular nominal level, e.g., corresponding to the higher (e.g., highest) nominal level, such that operation of certain devices can remain relatively uniform regardless of which of the acceptable ranges of supply voltage Vcc is presently connected to that memory device. For example, during a sensing operation (e.g., a read operation) on a string of series-connected memory cells, e.g., NAND string $206_0$, the select gates $210_0$ and $212_0$ might be configured to each receive a select gate voltage (e.g., Vsg) having a particular voltage level regardless of the voltage level of the power supply Vcc. Generation of different voltage levels for internal use by the memory device is well understood such as through the use of a voltage generator, e.g., a charge pump.

Figure 2B:
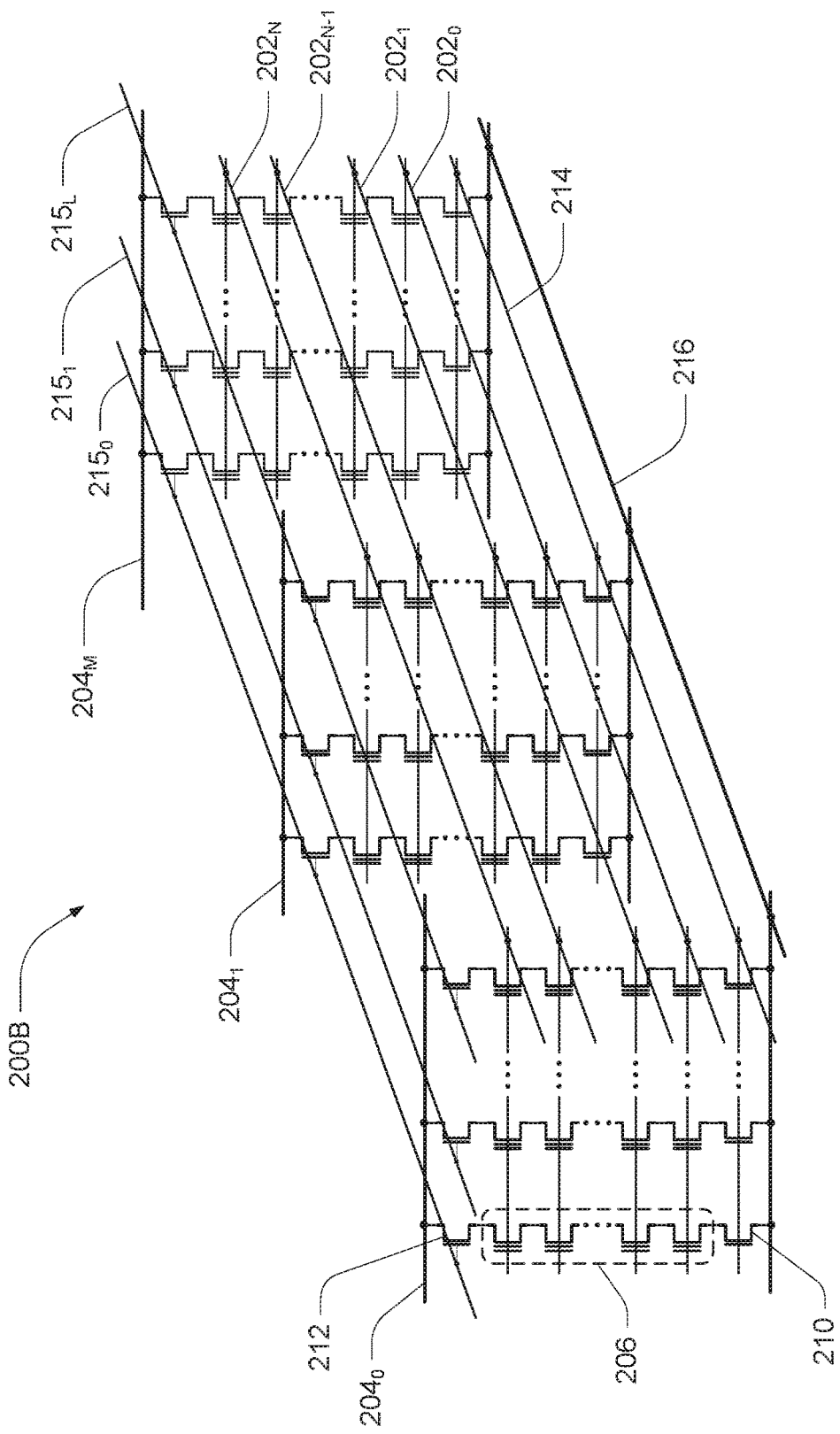

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

In prior art erase operations, the large magnitude (e.g., absolute value) of the erase voltages (e.g., 25V) applied to the data lines and source is stressful, which can lead to reliability concerns in the periphery circuitry of a memory. Such erase voltages typically require the use of high-voltage isolation techniques and high-voltage switching to decode and supply the desired voltage levels to a block of memory cells selected for erasure without adversely affecting unselected blocks of memory cells. This can lead to increased size of the periphery circuitry, e.g., decode circuitry and its drivers. Various embodiments seek to mitigate these issues by reducing the magnitude of the erase voltages applied to the data lines and source.

Figure 3:
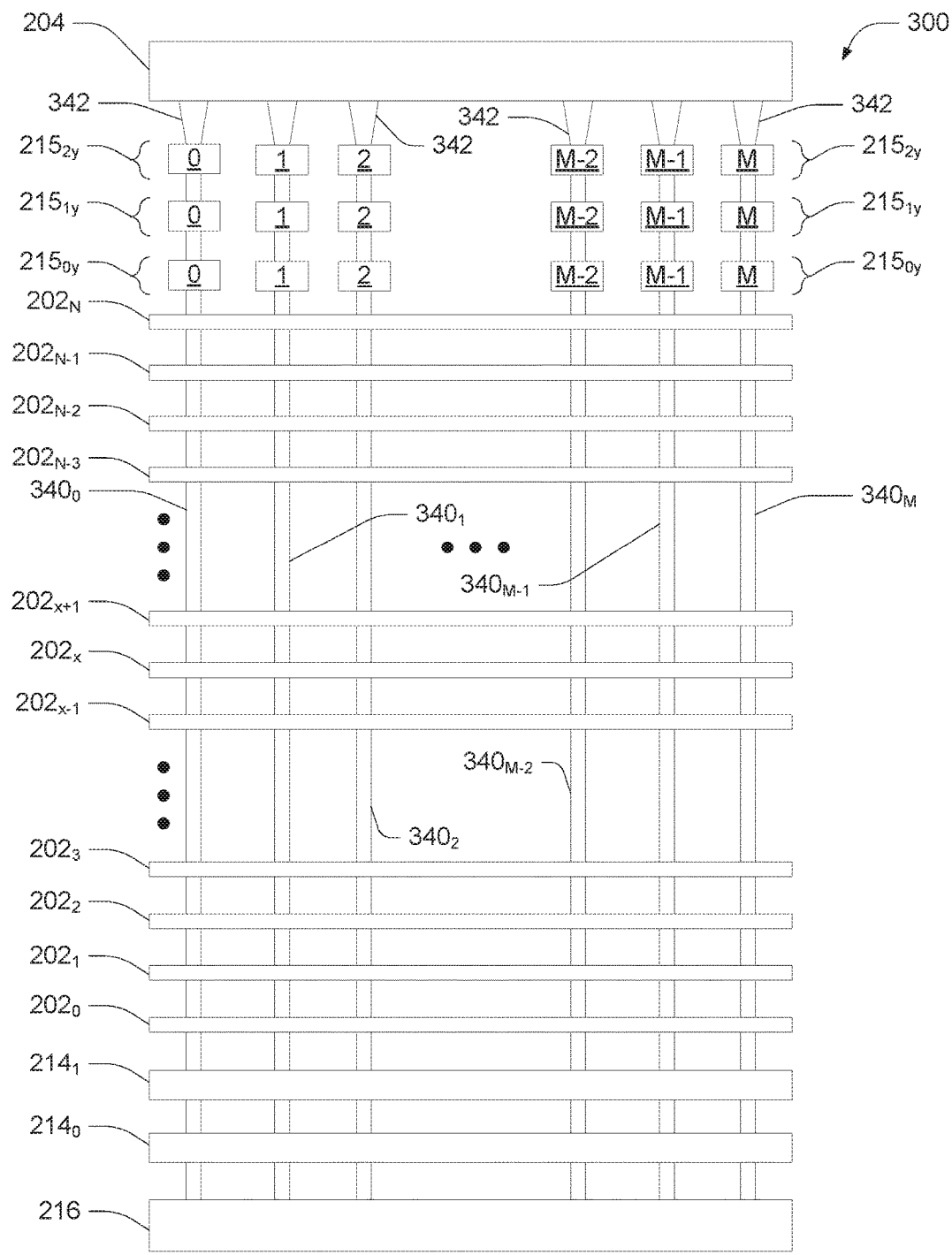
FIG. 3 is a cross-sectional view of a portion of an array of memory cells as could be used in a memory of the type described with reference to FIG. 1.

FIG. 3 is a cross-sectional view of a portion of an array of memory cells 300 as could be used in a memory of the type described with reference to FIG. 1, e.g., as a portion of array of memory cells 104. Like numbered elements in FIG. 3 correspond to the description as provided with respect to FIG. 2A. Similar to FIG. 2A, the array of memory cells 300 depicts N access lines, e.g., word lines 202. A memory cell (not depicted in FIG. 3) might be formed at each intersection of an word line 202 and a pillar 340 (e.g., pillars $340_0$-$340_M$) of semiconductor material. The pillars 340 may form channels for the memory cells and select gates.

FIG. 3 depicts that the array of memory cells 300 might utilize more than one select gate at each end of a string of series-connected memory cells, controlled by select lines 214 (e.g., $214_0$ and $214_1$) and select lines 215 (e.g., $215_{0y}$, $215_{1y}$, and $215_{2y}$, where y=0 to M). In this example, a select gate (e.g., source select transistor) might be formed at the intersection of the select line $214_0$ and the pillar $340_0$, and another select gate (e.g., source select transistor) might be formed at the intersection of the select line $214_1$ and the pillar $340_0$. Similarly, a select gate (e.g., drain select transistor) might be formed at the intersection of the select line $215_{00}$ and the pillar $340_0$, another select gate (e.g., drain select transistor) might be formed at the intersection of the select line $215_{10}$ and the pillar $340_0$, and still another select gate (e.g., drain select transistor) might be formed at the intersection of the select line $215_{20}$ and the pillar $340_0$. Remaining pillars 340 may provide similar structure in their intersections with select lines 214 and 215. Each pillar 340 may be connected to the data line, e.g., bit line 204, through a contact 342, and further connected to the source 216.

Memory cells formed at intersections of the word lines 202 and the pillars 340 might be operated to store data at different densities, e.g., storing differing numbers of bits per memory cell. The number of bits might be some value zero or greater, either integer or fractional. For example, memory cells formed at the intersections of word lines $202_0$ and $202_N$ with the pillars 340 might be operated to store data at a first density. The first density might be zero bits per memory cell, e.g., dummy memory cells that are not operated to store user data. Memory cells formed at the intersections of word lines $202_1$ and $202_{N-1}$ might be operated to store data at a second density greater than or equal to the first density. For example, the second density might be one bit per memory cell. Memory cells formed at the intersections of word lines $202_2$ and $202_{N-2}$ might be operated to store data at a third density greater than or equal to the second density. For example, the third density might be two bits per memory cell. And memory cells formed at the intersections of word lines $202_3$ through $202_{N-3}$ might be operated to store data at a fourth density greater than or equal to the third density. For example, the fourth density might be three bits per memory cell.

Figure 4A:
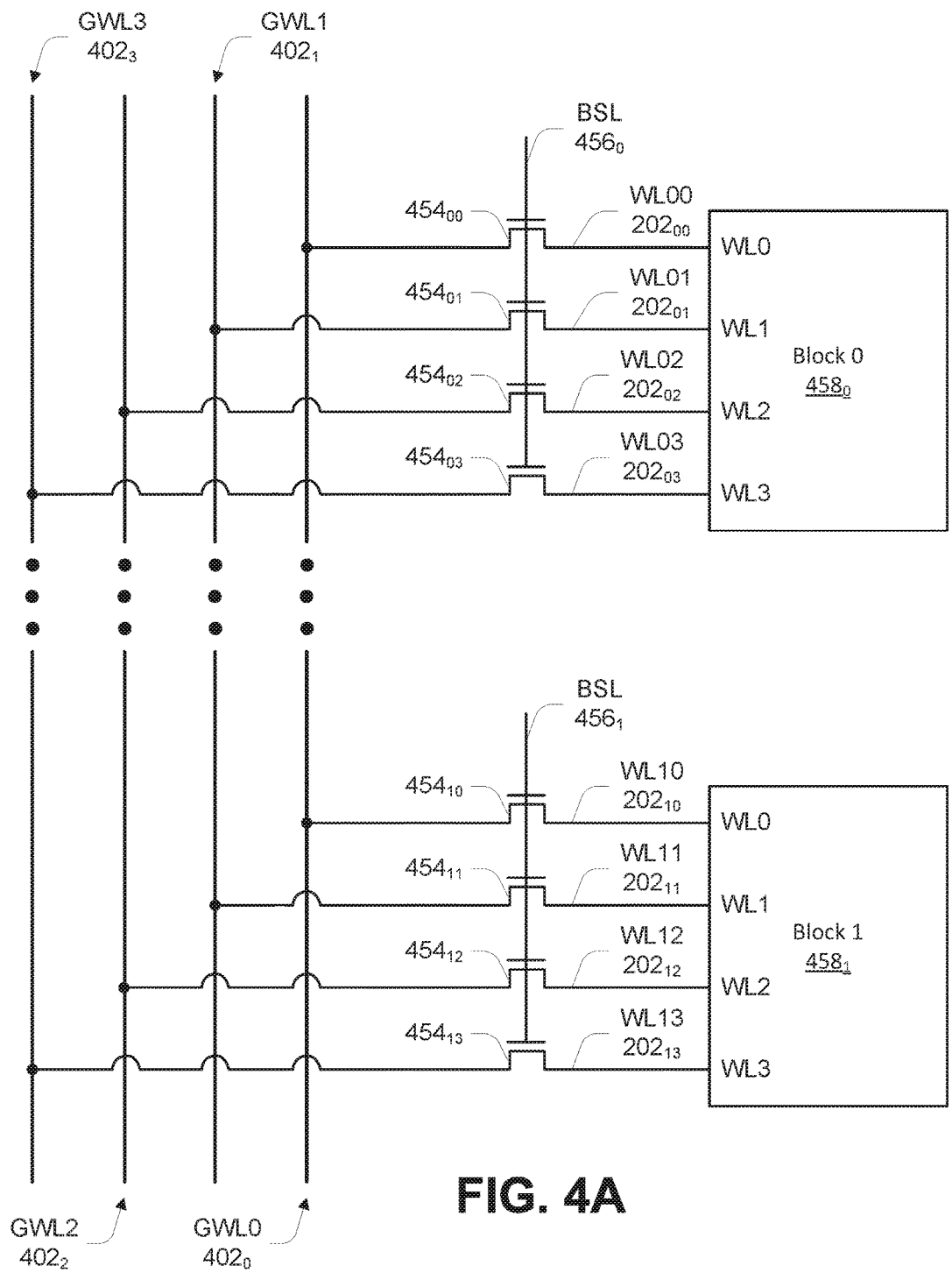
FIG. 4A is a schematic of a portion of an array of memory cells as could be used in a memory device of the type described with reference to FIG. 1.

As referenced with respect to FIG. 2A, local access lines, e.g., word lines 202, may be connected to global access lines in a many-to-one relationship. FIG. 4A is a schematic of a portion of an array of memory cells as could be used in a memory device of the type described with reference to FIG. 1 and depicting this many-to-one relationship between local access lines (e.g., word lines 202) and global access lines (e.g., global word lines 402).

As depicted in FIG. 4A, a plurality of blocks of memory cells 458 may have their local access lines (e.g., word lines 202) commonly selectively connected to a plurality of global access lines (e.g., global word lines 402). A block of memory cells 458 may include a plurality of NAND strings 206 commonly coupled to a particular set of word lines 202. For example, the NAND strings $206_0$-$206_M$ of FIG. 2A, or some portion thereof, may represent a block of memory cells 458. Although FIG. 4A depicts only blocks of memory cells $458_0$ and $458_1$ (Block 0 and Block 1), additional blocks of memory cells 458 may have their word lines 202 commonly connected to global word lines 402 in a like manner. Similarly, although FIG. 4A depicts only four word lines 202, blocks of memory cells 458 may include fewer or more word lines 202. In applying the structure of FIG. 4A to the array structure of FIG. 3, it is clear that there would be N global word lines 402, i.e., GWL $402_0$ to $402_N$.

To facilitate memory access operations to specific blocks of memory cells 458 commonly coupled to a given set of global word lines 402, each block of memory cells 458 may have a corresponding set of block select transistors 454 in a one-to-one relationship with their word lines 202. Control gates of the set of block select transistors 454 for a given block of memory cells 458 may have their control gates commonly connected to a corresponding block select line 456. For example, for block of memory cells $458_0$, word line $202_{00}$ may be selectively connected to global word line $402_0$ through block select transistor $454_{00}$, word line $202_{01}$ may be selectively connected to global word line $402_1$ through block select transistor $454_{01}$, word line $202_{02}$ may be selectively connected to global word line $402_2$ through block select transistor $454_{02}$, and word line $202_{03}$ may be selectively connected to global word line $402_3$ through block select transistor $454_{03}$, while block select transistors $454_{00}$-$454_{03}$ are responsive to a control signal received on block select line $456_0$.

Figure 4B:
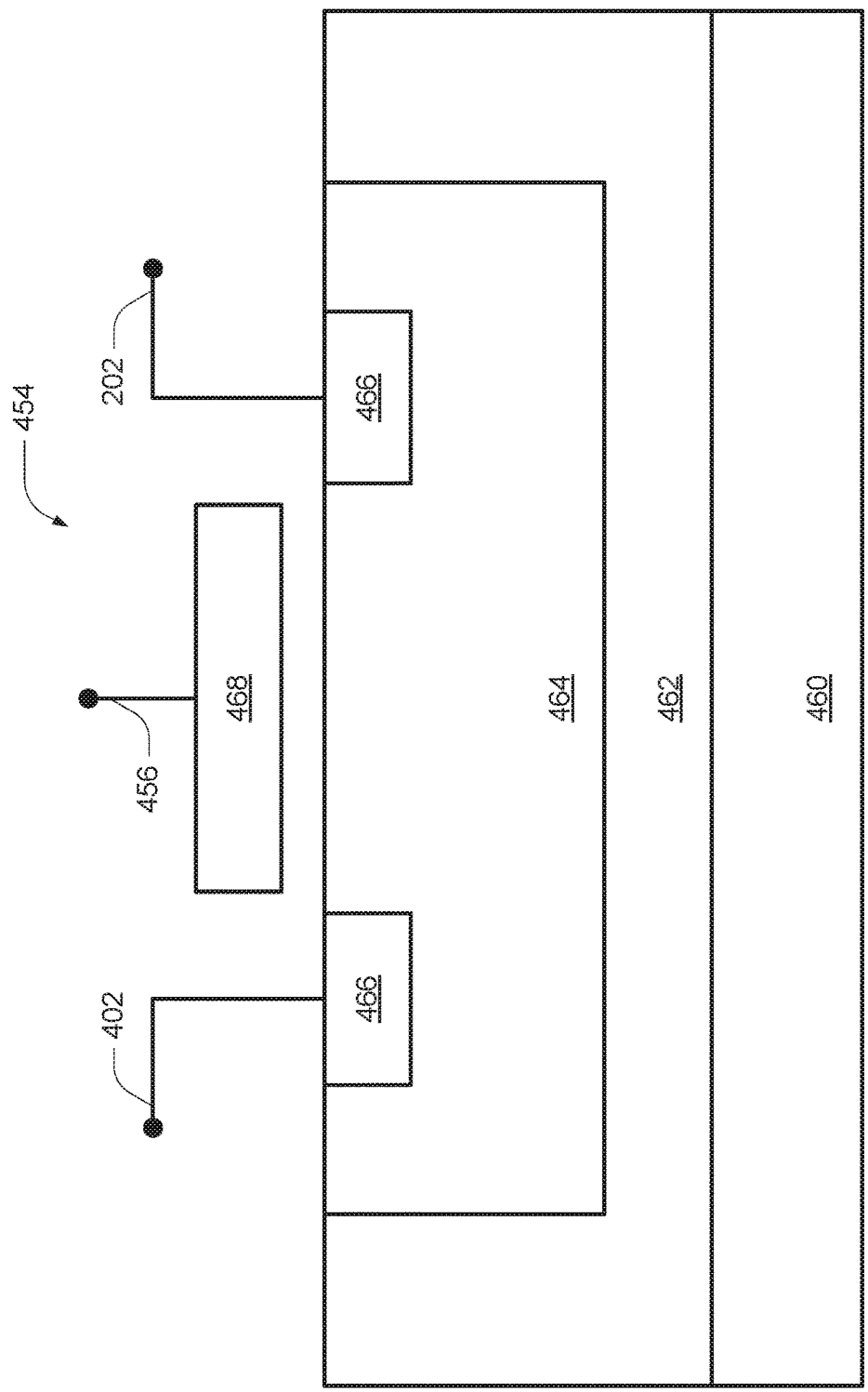
FIG. 4B is a cross-sectional view of a block select transistor of FIG. 4A.

Block select transistors may be high-voltage devices, i.e., configured to switch voltage levels in excess of the voltage level of the select gate voltage Vsg, e.g., voltage levels in excess of two times the voltage level of the select gate voltage Vsg. Such switching devices may require increased isolation. FIG. 4B is a cross-sectional view of a block select transistor 454, having a control gate 468 and source/drain regions 466, wherein the control gate 468 is connected to a block select line 456. The block select transistor 454 may be formed in first well of semiconductor material 464, The first well of semiconductor material may be separated from a semiconductor substrate 460 by a second well (e.g., deep well) of semiconductor material 462. The semiconductor substrate 460, as well as the first well of semiconductor material 464, may have a first conductivity type, e.g., a p-type conductivity. The second well of semiconductor material 462, as well as the source/drain regions 466, may have a second conductivity type different than (e.g., opposite) the first conductivity type, e.g., the second well of semiconductor material may have an n-type conductivity. This structure is commonly referred to as a triple-well construction and may be used to provide isolation of high-magnitude and/or negative voltage levels applied to the global word line 402 during access operations. For a selected block of memory cells 458, e.g., selected for an erase operation, the block select line 456 might be connected to receive a pass voltage Vpass sufficient to pass the voltage level of the global word line 402 to the local word line 202, which might be the reference potential or 0V, for example. For the unselected blocks of memory cells 458, the block select line 456 might be connected to receive a voltage level sufficient to inhibit current flow, allowing the local word line 202 to electrically float. For example, the block select line 456 of an unselected block might be connected to receive a voltage level substantially equal to (e.g., equal to) the voltage level of the global word line 402 having the most negative voltage level.

In erasing memory cells, e.g., a string of series-connected memory cells or a block of memory cells containing a number of strings of series-connected memory cells, various voltage levels may be applied to various nodes described with reference to FIGS. 2A, 2B, 3, and 4A. As noted previously, various embodiments facilitate a reduction in magnitude of the voltage levels applied to the data line and source during an erase operation. By increasing the magnitude of voltage levels applied to access lines during the erase operation, the magnitude applied to the data line and source can be reduced. This reduction in magnitude of voltage levels applied to the data line and source may facilitate easing of design rules for isolation of such structures, e.g., may facilitate a reduction in isolation requirements. Furthermore, as access lines are typically subjected to high-magnitude voltages during programming operations, it may be possible to perform erase operations in accordance with embodiments without altering design rules for the isolation of the access lines. This can lead to a reduction in size of the periphery circuitry. Table 1 provides two examples of voltage levels applied to various nodes during an erase operation.

TABLE 1

| Node | Voltage | |
|---|---|---|
| | Example 1 | Example 2 |
| BL 204 | 3 V | 10 V |
| SGD2 $215_{2y}$ | 0 V | 7 V |
| SGD1 $215_{1y}$ | −2 V | 5 V |
| SGD0 $215_{0y}$ | −2 V | 5 V |
| WLN $202_N$ | −12 V | −5 V |
| WLN−1 $202_{N-1}$ | −19 V | −12 V |
| WLN−2 $202_{N-2}$ | −19 V | −12 V |
| WLN−3 $202_{N-3}$ | −22 V | −15 V |
| WLx+1 $202_{x+1}$ | −22 V | −15 V |
| WLx $202_x$ | −22 V | −15 V |
| WLx−1 $202_{x-1}$ | −22 V | −15 V |
| WL3 $202_3$ | −22 V | −15 V |
| WL2 $202_2$ | −19 V | −12 V |
| WL1 $202_1$ | −19 V | −12 V |
| WL0 $202_0$ | −12 V | −5 V |
| SGS1 $214_1$ | −2 V | 5 V |
| SGS0 $214_0$ | 0 V | 7 V |
| SRC 216 | 3 V | 10 V |
| GWL $402_0$ and $402_N$ | −12 V | −5 V |
| GWL $402_1$, $402_2$, $402_{N-2}$, and $402_{N-1}$ | −19 V | −12 V |
| GWL $402_3$ to $402_{N-3}$ | −22 V | −15 V |
| BSL 456 (selected) | 0 V | 0 V |
| BSL 456 (unselected) | −22 V | −15 V |

In general, during an erase operation, voltage levels applied to some portion of the word lines 202, e.g., word lines $202_3$ through $202_{N-3}$, might have a magnitude greater than the magnitude of the voltage levels applied to the bit line 204 and the source 216. For some embodiments, the voltage levels applied to the bit line 204 and the source 216 are substantially the same (e.g., the same or intended to be the same). Voltage levels applied to another portion of the word lines 202, e.g., word lines $202_1$, $202_2$, $202_{N-2}$ and $202_{N-1}$, might have a magnitude less than the magnitude of the voltage levels applied to the word lines $202_3$ through $202_{N-3}$. Voltage levels applied to still another portion of the word lines 202, e.g., word lines $202_0$ and $202_N$, might have a magnitude less than the magnitude of the voltage levels applied to the word lines $202_1$, $202_2$, $202_{N-2}$ and $202_{N-1}$. Voltage levels applied to some portion of the select lines, e.g., select lines $214_1$, $215_{0y}$, and $215_{1y}$, might be selected to induce gate induced drain leakage (GIDL) in order to raise the voltage level of the pillars 340 during the erase operation, and thus might have fixed ΔV with respect to the voltage level applied to the source 216 and data line 204, respectively. For example, the voltage levels applied to the select line $214_1$ might be 5V less than the voltage level applied to the source 216, and the voltage levels applied to the select lines $215_{0y}$, and $215_{1y}$ might be 5V less than the voltage level applied to the data line 204. Voltage levels applied to another portion of the select lines, e.g., select lines $214_1$ and $215_{2y}$, might be selected to reduce stress during the erase operation, and thus might have some value between the voltage level applied to an adjacent select line, e.g., select line $214_0$ or $215_{1y}$, respectively, and the voltage level applied to the data line 204 or source 216, respectively.

Figure 5A:
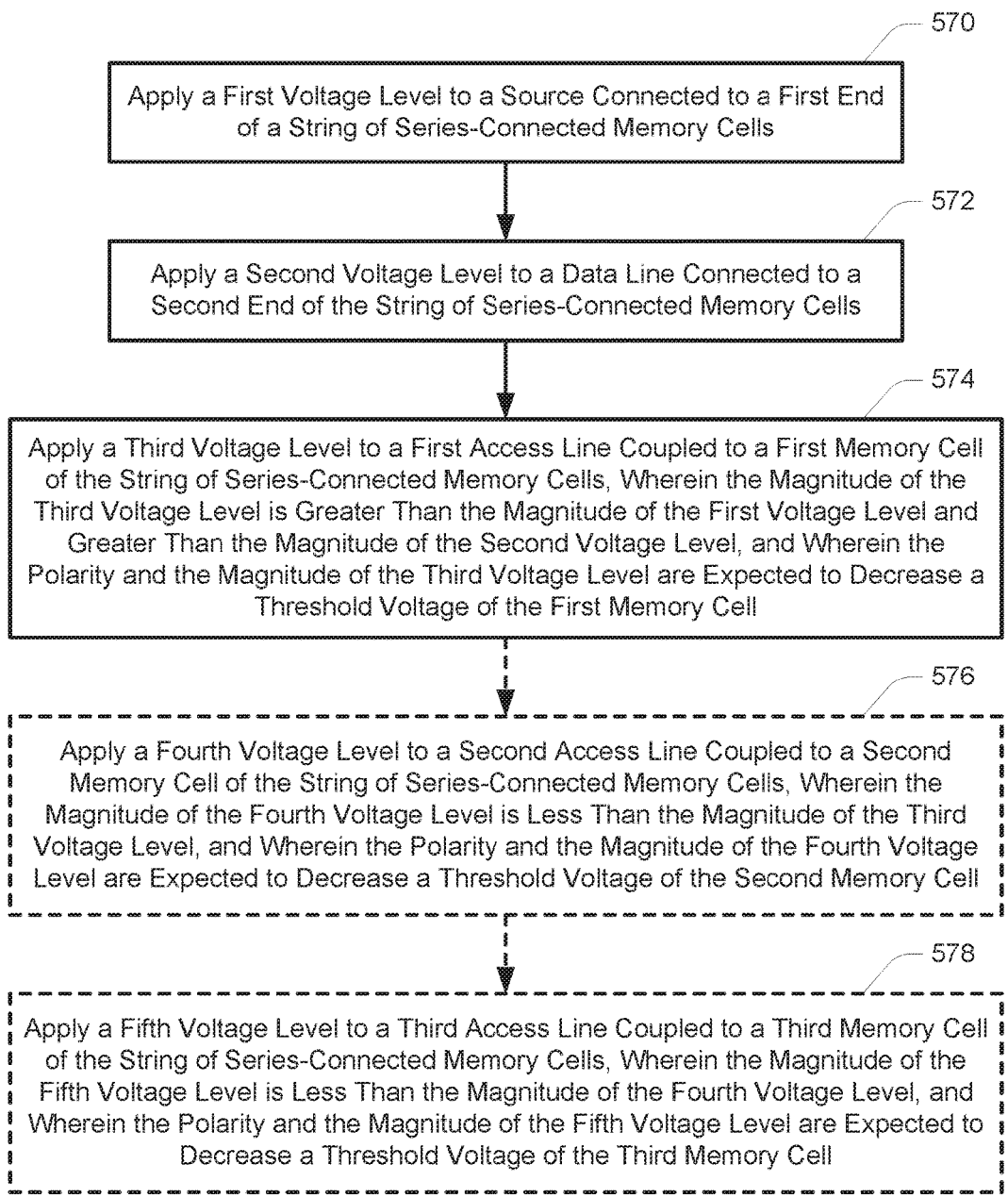
FIGS. 5A-5B are flowcharts of methods of operating a memory device according to embodiments.

FIG. 5A is a flowchart of a method of operating a memory. For example, FIG. 5A may represent a portion of an erase operation. At 570, a first voltage level may be applied to a source (e.g., source 216 of FIG. 3) connected to a first end of a string of series-connected memory cells. The source may further be connected to additional strings of series-connected memory cells. For example, the source may be connected to the strings of memory cells of a block of memory cells. At 572, a second voltage level may be applied to a data line (e.g., bit line 204 of FIG. 3) connected to a second end (e.g., opposite end) of the sting of memory cells. Similarly, the data line may be connected to additional strings of series-connected memory cells. For some embodiments, the first voltage level and the second voltage level are the same voltage level. For some embodiments, the first voltage level and the second voltage level are each less than or equal to Vcc or Vsg.

At 574, a third voltage level is applied to a first access line coupled to a first memory cell of the string of series connected memory cells. The first access line may further be coupled to corresponding memory cells of additional strings of series-connected memory cells. For example, the first access line might be any one of the word lines $202_3$ through $202_{N-3}$ of FIG. 3. The third voltage level has a magnitude greater than the magnitude of the first voltage level and greater than the magnitude of the second voltage level. The third voltage level further has a polarity (e.g., negative polarity) and magnitude that are expected to decrease a threshold voltage of the first memory cell when applied concurrently with the first voltage level to the data line and the second voltage level to the source. As used herein, a first act and a second act occur concurrently when the first act occurs simultaneously with the second act for at least a portion of a duration of the second act. For example, for at least a portion of the time of applying the third voltage level to the first access line, the first voltage level, the second voltage level and the third voltage level are being applied simultaneously to their respective, data line, source or first access line.

Optionally, at 576, a fourth voltage level is applied to a second access line coupled to a second memory cell of the string of series connected memory cells. The second access line may further be coupled to corresponding memory cells of additional strings of series-connected memory cells. For example, the second access line might be any one of the word lines $202_1$, $202_2$, $202_{N-2}$ and $202_{N-1}$ of FIG. 3. The fourth voltage level has a magnitude less than the magnitude of the third voltage level. The fourth voltage level further has a polarity (e.g., negative polarity) and magnitude that are expected to decrease a threshold voltage of the second memory cell when applied concurrently with the first voltage level to the data line and the second voltage level to the source. The fourth voltage level might be applied to the second access line concurrently with applying the third voltage level to the first access line.

Optionally, at 578, a fifth voltage level is applied to a third access line coupled to a third memory cell of the string of series connected memory cells. The third access line may further be coupled to corresponding memory cells of additional strings of series-connected memory cells. For example, the third access line might be any one of the word lines $202_0$ and $202_N$ of FIG. 3. The fifth voltage level has a magnitude less than the magnitude of the fourth voltage level. The firth voltage level further has a polarity (e.g., negative polarity) and magnitude that are expected to decrease a threshold voltage of the third memory cell when applied concurrently with the first voltage level to the data line and the second voltage level to the source. The fifth voltage level might be applied to the third access line concurrently with applying the third voltage level to the first access line, and concurrently with applying the fourth voltage level to the second access line.

Figure 5B:
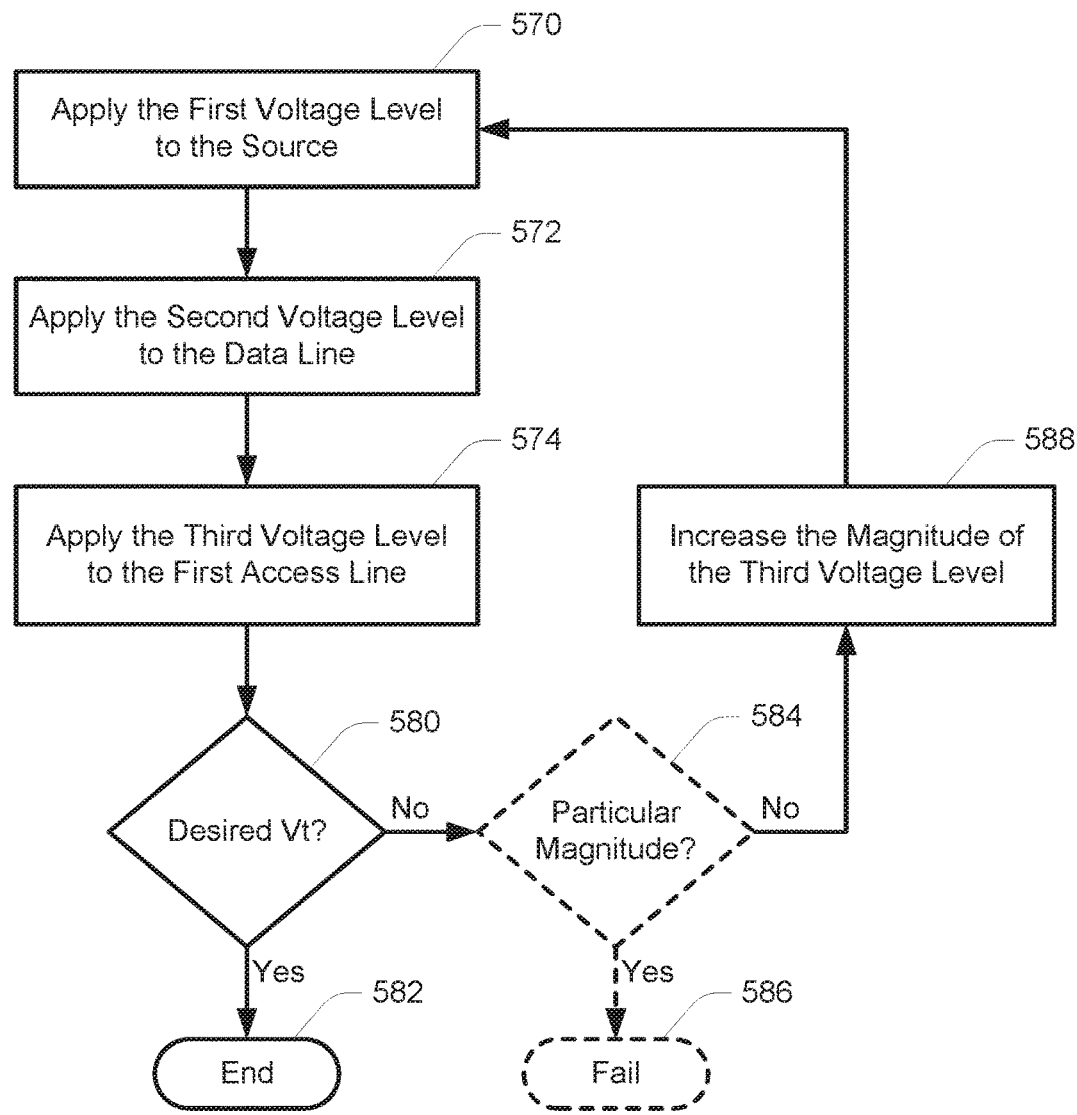

The method of FIG. 5A might represent one cycle of an erase operation. For example, the erase operation may include a number of cycles of applying voltage levels to reduce the respective threshold voltages of one or more memory cells, and verifying whether those memory cells have reached a desired threshold voltage. FIG. 5B is a flowchart of a method of operating a memory device facilitating such an erase operation.

Reference numbers 570, 572 and 574 of FIG. 5B might correspond to the description as provided with reference to FIG. 5A. After applying the third voltage level to the first access line at 574, which might be referred to as an erase pulse, a decision might be made at 580 whether the first memory cell is deemed to have a desired threshold voltage. The determination does not require that the first memory cell have the desired threshold voltage. For example, determining whether the first memory cell is deemed to have a desired threshold voltage may include applying an erase verify voltage to the word lines 202 of the string of series-connected memory cells, wherein the erase verify voltage might be expected to activate any memory cell of the string of series-connected memory cells having a threshold voltage less than or equal to the desired threshold voltage, and determining if there is current flow through the string of series-connected memory cells.

If the first memory cell is deemed to have the desired threshold voltage at 580, the method might end at 582. If the first memory cell is not deemed to have the desired threshold voltage at 580, a decision might optionally be made at 584 whether the third voltage level is deemed to have a particular value. The particular value may represent a maximum magnitude for the erase operation. For example, the particular value might correspond to a voltage level of −22V for Example 1 of Table 1 or −15V for Example 2 of Table 1. Determining whether the third voltage level is deemed to have the particular value might include counting a number of times an erase pulse has been applied at 574.

If the third voltage level is deemed to have the particular value at 584, the method might indicate a failure of the erase operation at 586. If the third voltage level is not deemed to have the particular value at 584 or otherwise, the magnitude of the third voltage level might be increased at 588 before returning to 570/572/574 to repeat the method for another cycle. Increasing the magnitude of the third voltage level having a negative polarity might include decreasing the third voltage level. Decreasing the third voltage level might include decreasing the third voltage level by some ΔV (e.g., constant ΔV) for each cycle 570/572/574/580/584/588. For example, the third voltage level might be −20V for one cycle, −21V for a next subsequent cycle, and −22V for a still next subsequent cycle.

For embodiments applying the fourth voltage level at 576 in FIG. 5A and/or applying the fifth voltage level at 578 in FIG. 5A, the method of FIG. 5B may further include the processes of 576 and 578 as well. Similar to FIG. 5A, applying the first, second, third, fourth and fifth voltage levels may be concurrent.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory device, comprising:
applying a first voltage level to a source connected to a first end of a string of series-connected memory cells;
applying a second voltage level to a data line connected to a second end of the string of series-connected memory cells; and
applying a third voltage level to a first access line coupled to a first memory cell of the string of series-connected memory cells concurrently with applying the first voltage level to the source and applying the second voltage level to the data line;
wherein a magnitude of the third voltage level is greater than a magnitude of the first voltage level and greater than a magnitude of the second voltage level;
wherein a polarity and the magnitude of the third voltage level are expected to decrease a threshold voltage of the first memory cell when concurrently applying the third voltage level to the first access line, the first voltage level to the source and the second voltage level to the data line; and
wherein applying the first voltage level to the source and applying the second voltage level to the data line comprises applying a same voltage level to the source and to the data line.

2. A method of operating a memory device, comprising:
applying a first voltage level to a source connected to a first end of a string of series-connected memory cells;
applying a second voltage level to a data line connected to a second end of the string of series-connected memory cells; and
applying a third voltage level to a first access line coupled to a first memory cell of the string of series-connected memory cells concurrently with applying the first voltage level to the source and applying the second voltage level to the data line;

wherein a magnitude of the third voltage level is greater than a magnitude of the first voltage level and greater than a magnitude of the second voltage level;

wherein a polarity and the magnitude of the third voltage level are expected to decrease a threshold voltage of the first memory cell when concurrently applying the third voltage level to the first access line, the first voltage level to the source and the second voltage level to the data line; and wherein applying the first voltage level to the source and applying the second voltage level to the data line comprises applying voltage levels that are each less than or equal to a select gate voltage applied during a sensing operation on the string of series-connected memory cells.

3. A method of operating a memory device, comprising:

applying a first voltage level to a source connected to a first end of a string of series-connected memory cells;

applying a second voltage level to a data line connected to a second end of the string of series-connected memory cells; and applying a third voltage level to a first access line coupled to a first memory cell of the string of series-connected memory cells concurrently with applying the first voltage level to the source and applying the second voltage level to the data line;

wherein a magnitude of the third voltage level is greater than a magnitude of the first voltage level and greater than a magnitude of the second voltage level;

wherein a polarity and the magnitude of the third voltage level are expected to decrease a threshold voltage of the first memory cell when concurrently applying the third voltage level to the first access line, the first voltage level to the source and the second voltage level to the data line; and wherein applying the first voltage level to the source and applying the second voltage level to the data line comprises applying voltage levels that are each less than or equal to a supply voltage Vcc of the memory device.

4. The method of claim 3, wherein applying the first voltage level to the source and applying the second voltage level to the data line comprises applying voltage levels that are each greater than or equal to a reference potential Vss of the memory device.

5. A method of operating a memory device, comprising:

applying a first voltage level to a source connected to a first end of a string of series-connected memory cells;

applying a second voltage level to a data line connected to a second end of the string of series-connected memory cells; and applying a third voltage level to a first access line coupled to a first memory cell of the string of series-connected memory cells concurrently with applying the first voltage level to the source and applying the second voltage level to the data line;

applying a fourth voltage level to a second access line coupled to a second memory cell of the string of series-connected memory cells concurrently with applying the first voltage level to the source and applying the second voltage level to the data line;

wherein a magnitude of the third voltage level is greater than a magnitude of the first voltage level and greater than a magnitude of the second voltage level;

wherein a polarity and the magnitude of the third voltage level are expected to decrease a threshold voltage of the first memory cell when concurrently applying the third voltage level to the first access line, the first voltage level to the source and the second voltage level to the data line;

wherein a magnitude of the fourth voltage level is less than the magnitude of the third voltage level; and wherein a polarity and the magnitude of the fourth voltage level are expected to decrease a threshold voltage of the second memory cell when concurrently applying the fourth voltage level to the second access line, the first voltage level to the source and the second voltage level to the data line.

6. The method of claim 5, wherein the polarity of the third voltage level and the polarity of the fourth voltage level are each negative.

7. The method of claim 6, wherein a polarity of the first voltage level and a polarity of the second voltage level are each positive.

8. The method of claim 5, further comprising:

applying a fifth voltage level to a third access line coupled to a third memory cell of the string of series-connected memory cells concurrently with applying the first voltage level to the source and applying the second voltage level to the data line;

wherein a magnitude of the fifth voltage level is less than the magnitude of the fourth voltage level; and wherein a polarity and the magnitude of the fifth voltage level are expected to decrease a threshold voltage of the third memory cell when concurrently applying the fifth voltage level to the third access line, the first voltage level to the source and the second voltage level to the data line.

9. The method of claim 8, wherein the polarity of the third voltage level, the polarity of the fourth voltage level, and the polarity of the fifth voltage level are each negative, and wherein a polarity of the first voltage level and a polarity of the second voltage level are each positive.

10. The method of claim 9, wherein the magnitude of the fifth voltage level is less than or equal to the magnitude of the first voltage level and less than or equal to the magnitude of the second voltage level.

11. The method of claim 8, wherein the magnitude of the first voltage level, the magnitude of the fourth voltage level and the magnitude of the fifth voltage level are each greater than the magnitude of the first voltage level and greater than the magnitude of the second voltage level.

12. A method of operating a memory device, comprising:

applying a first voltage level to a source connected to a first end of a string of series-connected memory cells;

applying a second voltage level to a data line connected to a second end of the string of series-connected memory cells;

applying a third voltage level to a first access line coupled to a first memory cell of the string of series-connected memory cells concurrently with applying the first voltage level to the source and applying the second voltage level to the data line;

wherein a magnitude of the third voltage level is greater than a magnitude of the first voltage level and greater than a magnitude of the second voltage level; and wherein a polarity and the magnitude of the third voltage level are expected to decrease a threshold voltage of the first memory cell when concurrently applying the third voltage level to the first access line, the first voltage level to the source and the second voltage level to the data line;

determining whether the first memory cell is deemed to have a desired threshold voltage;

if the first memory cell is not deemed to have the desired threshold voltage, increasing the magnitude of the third voltage level before repeating applying the first voltage level to the source, applying the second voltage level to the data line and applying the third voltage level to the first access line.

13. The method of claim 12, wherein the string of series-connected memory cells is a first string of series-connected memory cells of a plurality of strings of memory cells, the method further comprising:
   wherein applying the first voltage level to the source comprises applying the first voltage level to the source connected to a first end of each string of series-connected memory cells of the plurality of strings of series-connected memory cells;
   wherein applying the second voltage level to the data line comprises applying the second voltage level to the data line connected to a second end of each string of series-connected memory cells of the plurality of strings of series-connected memory cells; and
   wherein applying the third voltage level to the first access line comprises applying the third voltage level to the first access line coupled to a first memory cell of each string of series-connected memory cells of the plurality of strings of series-connected memory cells.

14. The method of claim 12, wherein applying the first voltage level to the source connected to the first end of the string of series-connected memory cells comprises applying the first voltage level to the source connected to a string of series-connected memory cells selected for an erase operation.

15. A method of operating a memory device, comprising:
   applying a first voltage level to a source connected to a first end of a string of series-connected memory cells;
   applying a second voltage level to a data line connected to a second end of the string of series-connected memory cells;
   applying a third voltage level to a first plurality of access lines coupled to respective memory cells of a first plurality of memory cells of the string of series-connected memory cells concurrently with applying the first voltage level to the source and applying the second voltage level to the data line;
   applying a fourth voltage level to a second plurality of access lines coupled to respective memory cells of a second plurality of memory cells of the string of series-connected memory cells concurrently with applying the first voltage level to the source and applying the second voltage level to the data line; and
   applying a fifth voltage level to a third plurality of access lines coupled to respective memory cells of a third plurality of memory cells of the string of series-connected memory cells concurrently with applying the first voltage level to the source and applying the second voltage level to the data line;
   wherein a magnitude of the third voltage level is greater than a magnitude of the first voltage level and greater than a magnitude of the second voltage level;
   wherein a magnitude of the fourth voltage level is less than or equal to the magnitude of the third voltage level;
   wherein a magnitude of the fifth voltage level is less than or equal to the magnitude of the fourth voltage level; and
   wherein a polarity and the magnitude of the third voltage level are expected to decrease a threshold voltage of the first memory cell when concurrently applying the third voltage level to the first access line, the first voltage level to the source and the second voltage level to the data line.

16. The method of claim 15, wherein the first plurality of memory cells collectively comprise a first contiguous portion of the string of series-connected memory cells.

17. The method of claim 16, wherein the first contiguous portion of the string of series-connected memory cells is located in the string of series-connected memory cells between memory cells of the second plurality of memory cells, and wherein the first plurality of memory cells and the second plurality of memory cells collectively comprise a second contiguous portion of the string of series-connected memory cells.

18. The method of claim 17, wherein the second contiguous portion of the string of series-connected memory cells is located in the string of series-connected memory cells between memory cells of the third plurality of memory cells, and wherein the first plurality of memory cells, the second plurality of memory cells and the third plurality of memory cells collectively form the string of series-connected memory cells.

* * * * *